(12) United States Patent
Brombach et al.

(10) Patent No.: US 11,258,262 B2
(45) Date of Patent: Feb. 22, 2022

(54) METHOD FOR THE VOLTAGE-IMPRESSING FEED OF ELECTRICAL POWER INTO AN ELECTRICAL SUPPLY GRID BY MEANS OF A WIND POWER INSTALLATION

(71) Applicant: Wobben Properties GmbH, Aurich (DE)

(72) Inventors: Johannes Brombach, Berlin (DE); Eckard Quitmann, Bremen (DE); Hanna Emanuel, Bremen (DE)

(73) Assignee: Wobben Properties GmbH, Aurich (DE)

( * ) Notice: Subject to any disclaimer, the term of this patent is extended or adjusted under 35 U.S.C. 154(b) by 0 days.

(21) Appl. No.: 17/066,078

(22) Filed: Oct. 8, 2020

(65) Prior Publication Data
US 2021/0111563 A1   Apr. 15, 2021

(30) Foreign Application Priority Data

Oct. 11, 2019   (DE) .......................... 102019127484.2

(51) Int. Cl.
| | |
|---|---|
| *H02J 3/38* | (2006.01) |
| *G01R 19/165* | (2006.01) |
| *H02M 1/32* | (2007.01) |
| *H02M 7/04* | (2006.01) |
| *H02M 7/44* | (2006.01) |
| *H02M 1/00* | (2006.01) |

(52) U.S. Cl.
CPC ........ *H02J 3/381* (2013.01); *G01R 19/16538* (2013.01); *H02M 1/32* (2013.01); *H02M 7/04* (2013.01); *H02M 7/44* (2013.01); *H02J 2300/28* (2020.01); *H02M 1/0025* (2021.05)

(58) Field of Classification Search
CPC ............................ H02J 3/381; H02J 2300/28; G01R 19/16538; H02M 1/32; H02M 7/04; H02M 7/44; H02M 1/0025
USPC .......................................................... 307/78
See application file for complete search history.

(56) References Cited

U.S. PATENT DOCUMENTS 8,664,788 B1 *   3/2014   Wagoner ............... F03D 7/0244
290/44

FOREIGN PATENT DOCUMENTS

WO   2019/120397 A1   6/2019

* cited by examiner

*Primary Examiner* — Hal Kaplan
(74) *Attorney, Agent, or Firm* — Seed IP Law Group LLP

(57) ABSTRACT

Provided is a method for feeding electrical power into an electrical supply grid having a grid voltage by a wind power installation. The installation comprises a generator for generating a generator current, an active rectifier for rectifying the generator current into a rectified current, a direct voltage intermediate circuit having an intermediate circuit voltage for receiving the rectified current, a chopper circuit for diverting excess energy out of the direct voltage intermediate circuit, and an inverter for generating an infeed current for feeding into the electrical supply grid. The feed takes place in a voltage-impressing manner, so that the inverter counteracts a deviation of the grid voltage from a voltage setpoint value through an adjustment of the fed current. The active rectifier has a lower current limit to limit a fall of the rectified current to protect the generator during a change of the grid voltage amplitude or phase.

19 Claims, 4 Drawing Sheets

METHOD FOR THE VOLTAGE-IMPRESSING FEED OF ELECTRICAL POWER INTO AN ELECTRICAL SUPPLY GRID BY MEANS OF A WIND POWER INSTALLATION

BACKGROUND

Technical Field

The present invention relates to a method for feeding electrical power into an electrical supply grid by means of a wind power installation. The present invention furthermore relates to a corresponding wind power installation.

Description of the Related Art

Wind power installations are known. They feed electrical power into an electrical supply grid. Wind power installations usually feed into an electrical supply grid in a current-impressing manner. This means in particular that large power stations that are also coupled to the electrical supply grid and that feed into the electrical supply grid by means of directly coupled synchronous generators predefine the grid voltage of the electrical supply grid. They also here specify the frequency and phase of the electrical supply grid, namely the frequency and phase of the grid voltage. Such large power stations thus specify the voltage, and thereby work in a voltage-impressing manner. This also in particular results from the physical properties of the synchronous generators.

The feed of wind power installations is thus oriented to this voltage predefined in this way, and they feed an electrical infeed current matching the said voltage. The voltage here only plays a subsidiary role if at all. It must be considered that, to influence the voltage, a reactive current component is set or changed, but that a specification of the voltage as the uppermost regulation target does not however occur. Rather, in particular, electrical power whose magnitude depends on how much power is available as a result of wind conditions is fed in. Only in special situations does a change in the real power come into consideration.

In the case of a voltage-impressing feed, the specification of the voltage that is to be fed, or made available in the electrical supply grid, is paramount. The wind power installation thus attempts to feed at a predefined voltage level, and to maintain this voltage level as far as possible in the electrical supply grid, and to proceed in particular in this manner. An infeed current does also result here, but rather plays the part of a means to an end.

A voltage-impressing feed and a current-impressing feed are respectively technical terms with the meaning explained above.

Until now it has not been usual to feed in a voltage-impressing manner with wind power installations, because such a voltage-impressing feed into a voltage-led electrical supply grid can be associated, in the presence of voltage variations in the electrical supply grid, with high variations in the real power. Such power variations are not wanted with wind power installations and, as a result of the wind being the primary energy source, are also only available to a limited extent.

Nevertheless, wind power installations are playing an increasingly important role in many regions or in many electrical supply grids, and are increasingly supplying a larger share of the power fed into the electrical supply grid. It can therefore be desirable for wind power installations to also supply their feed in a voltage-impressing manner or, in certain cases, even to be the only feed that operates in a voltage-impressing manner. This is a particular consideration if no conventional large power stations any longer feed into an electrical supply grid or a relevant grid segment, whether permanently or temporarily.

A further problem that can arise with a voltage-impressing feed by means of wind power installations is that sudden voltage variations of the grid voltage can lead to correspondingly marked, and in particular also to correspondingly fast, changes of the real power fed by the wind power installation. Such fast power changes can lead to similarly fast changes in the torque of the generator of the wind power installation. In particular, almost abrupt changes in the power fed can lead to correspondingly abrupt changes or almost abrupt changes in the torque of the wind power installation, i.e., to the torque of the generator. Depending on the height of such a step in the torque, or indeed any fast change in the torque, it can lead to mechanical stress or even to a mechanical hazard for the wind power installation.

BRIEF SUMMARY

Provided is a wind power installation that can feed in a voltage-impressing manner into the electrical supply grid without the wind power installation being subjected to a mechanical overload.

A method is provided. The method relates to the feed of electrical power into an electrical supply grid having a grid voltage by means of a wind power installation. A wind power installation is taken as a basis for this, comprising a generator, an active rectifier, a direct voltage intermediate circuit with a chopper circuit and an inverter. A generator current, namely usually a stator current, is generated with the generator. It is proposed in particular in this respect, that a synchronous generator is used as the generator. This can be separately excited, or may comprise permanent magnets.

This generator current that is developed, i.e., in particular stator current, is rectified using an active rectifier into a direct current, identified here as the rectified current, and supplied to the direct voltage intermediate circuit, i.e., fed into it. The direct voltage intermediate circuit receives this rectified current, or the energy that it brings with it. The active rectifier can also be referred to as the generator-side inverter, since it establishes a relationship between the rectified current and the generator current that is developed, wherein usually the energy only flows from the generator to the direct voltage intermediate circuit. In exceptional situations it can, however, be otherwise. In order to avoid confusion with the grid-side inverter, the term active rectifier is used here.

This active rectifier thus specifically rectifies the generator current that is developed, and can thereby also control or adjust the intermediate circuit voltage of the direct voltage intermediate circuit. The generator current that is developed, i.e., in particular the stator current of the generator, can moreover also be controlled with the active rectifier. The torque of the generator can thus also be controlled, or at least influenced, with the active rectifier. If the generator is designed as a permanently excited synchronous generator, then the control of the electrical torque of the generator takes place fundamentally by means of the stator current, and thereby using the active rectifier.

An inverter is connected to the direct voltage intermediate circuit in order to generate an infeed current for feeding into the electrical supply grid. This inverter thus constitutes a grid-side inverter, since it is connected to the electrical supply grid, although further elements such as, for example, a transformer, can be connected in between. Whenever an inverter is spoken of below, it is always this grid-side inverter that is intended, whereas the said generator-side inverter is referred to as the active rectifier.

It is then proposed that the feed takes place in a voltage-impressing manner. The inverter thus counteracts a deviation of the grid voltage from a voltage setpoint value through an adjustment of the current fed in. An output voltage can be specified at the output terminals of the inverter for this purpose, and the voltage-impressing feed adjusts this voltage at the output terminals, from which a level of the current, i.e., the infeed current, results. A current thus results on the basis of the directly regulated output voltage which can also be characterized in that the voltage at the terminals is held constant. In particular, the voltage is adjusted with stationary precision. Adjusting the voltage is the primary aim of the regulation. A voltage-impressing feed refers in particular to feed wherein the feeding device, in this case the wind power installation, also controls the level of the voltage fed in.

It is now proposed that for this purpose the active rectifier has a lower current limit, which can also simply be referred to as a current limit or direct current limit, in order to limit a drop in the rectified current to protect the generator in the event of a change in the amplitude and/or phase angle of the grid voltage. To implement this, the level of the rectified current, or also of the generator current that is to be rectified, in particular the stator current, can be monitored. It is, in particular, recognized here that a rise in the voltage of the grid voltage or a change in the angle of the grid voltage, particularly in respect of the voltage angle at the output terminals of the wind power installation, leads to a reduction in the real power fed in. This has an effect on the direct voltage intermediate circuit which can in turn lead to the rectified current being reduced. Too great a reduction in the rectified current can be avoided by the lower current limit, whereby mechanical overloads resulting from excessively fast changes to the torque in the generator are avoided. The lower current limit thus also limits generator power, and also a generator current, in particular stator current. The generator power, the generator current or the stator current can also be limited by a lower limit, with the same effect. This corresponds analogously to the limitation of the rectified current by the lower current limit, since the rectified current is thereby also limited.

It is proposed here that the lower current limit is set and modified depending on an operating point of the wind power installation. This takes place in particular depending on an operating point of the active rectifier.

A clear example, which does however also describe a relevant form of embodiment, consists in that the lower current limit is initially to be adjusted such that it lies at 5 to 15%, in particular 10%, in relation to a maximum rectified current or a rated rectified current, below the rectified current at that moment, at least at the beginning of a change to the rectified current of this level.

Too great a change in the torque of the generator should be avoided through the lower current limit. It is therefore proposed that the lower current limit is, however, changed further over time, in particular when the rectified current has reached the lower current limit, that is in particular has fallen to the value at that moment of the lower current limit. This lower current limit of the active rectifier is referred to here as the rectified current limitation. If it has been reached it can, however, be further changed, in particular lowered further, in order if necessary to permit a further reduction in the rectified current. The only thing that is important is that the rectified current does not exhibit excessively large changes over a predetermined time.

It is also equivalently possible for the generator current, in particular the stator current, to be limited, which can have the same effect as limiting the rectified current, at any rate when the limitation of the generator current, which is an alternating current, is related to the real component of the generator current that is developed. To that extent it is easier to limit the rectified current; limiting the generator current that is developed in the said manner fundamentally, however, leads to the same result.

It is furthermore proposed that the chopper circuit is controlled in such a way that it diverts excess energy that arises in the direct voltage intermediate circuit as a result of the lower current limit of the active rectifier, or a portion thereof, out of the direct voltage intermediate circuit. It is in particular recognized here that the lower current limit of the active rectifier, that is to say the rectified current limitation, can have the result that excess energy arises in the direct voltage intermediate circuit. This appearance of the excess energy can in particular signify that the generator is feeding more energy or more power into the direct voltage intermediate circuit than is being fed into the electrical supply grid. This energy can be diverted by the chopper circuit.

The chopper circuit operates here in particular in such a way that, using a pulsed method, it creates a pulsed current through a chopper resistor from the direct voltage intermediate circuit through the appropriate switching of one or a plurality of semiconductor switches. The energy diverted here is converted into heat in the chopper resistor.

In this way it is in particular possible to achieve that even very strong changes are possible in the current of the real current fed in in order to counteract a rising grid voltage, a change in the grid phase angle, or an increase in the grid frequency. A mechanical overload of the wind power installation, particularly an excessive or excessively fast change in the generator torque, can hereby be avoided. At the same time, only a small expenditure on apparatus, possibly no additional expense on apparatus, is necessary in order to realize this voltage-impressing feed. In particular, an additional energy store such as a battery bank or other electrical energy store going beyond an intermediate circuit capacitor can be avoided.

It is proposed according to one form of embodiment that the chopper circuit diverts energy from the direct voltage intermediate circuit as soon as the intermediate circuit voltage has reached a trigger voltage. The chopper circuit can thus be realized in a simple manner, in that it monitors the intermediate circuit voltage. If it becomes too high, the chopper circuit starts to divert energy, which can also be referred to as chopping.

This acts together with an active rectifier that regulates the intermediate circuit voltage by controlling the rectified current, in order to regulate the intermediate circuit voltage to a value or to a range below the trigger voltage. Normally, the active rectifier thus regulates the intermediate circuit voltage to a desired value or at least to a desired voltage range. The trigger voltage is here not reached, and the chopper circuit thus remains inactive.

It is, however, further proposed that the method functions in such a way that the intermediate circuit voltage continues to rise when the rectified current has reached the rectified current limit and is thereby restricted. This continues to rise until it has reached the trigger voltage. The final result is that the chopper circuit responds, and energy is diverted from the direct voltage intermediate circuit.

It is recognized that fundamentally a chopper circuit is designed to divert energy from a direct voltage intermediate circuit. If the direct voltage intermediate circuit reaches the trigger voltage, this diversion of the energy begins, thus also counteracting a further rise in the intermediate circuit voltage in the direct voltage intermediate circuit.

Through the preferred active rectifier, which regulates the intermediate circuit voltage, the intermediate circuit voltage can in principle be held without loss of energy at the desired voltage value or in the desired voltage range, i.e., voltage band. This is a good basis for the grid-side inverter to feed electrical power from there into the electrical supply grid.

It is, however, recognized that this otherwise advantageous active rectifier can lead to mechanical stress on the generator in the case of voltage-impressing feed. As a result of the voltage-impressing feed, corresponding changes in the voltage of the grid voltage can result in correspondingly fast, marked changes in the real power fed in. This becomes noticeable in the direct voltage intermediate circuit, and the active rectifier attempts to adjust for this. Thus if the real power fed in reduces, the infeed current, or the real component of the infeed current, also reduces. Through the adjustment of the intermediate circuit voltage, the rectified current, and thereby also the generator current or stator current, also reduces due to the active rectifier. This leads to a corresponding reduction in the generator torque. If these processes occur quickly, i.e., in particular abruptly, then a correspondingly fast or abrupt change to the generator torque also arises.

The chopper circuit cannot prevent this, and remains inactive, since the active rectifier adjusts the intermediate circuit voltage, and the trigger voltage is consequently not reached.

This problem has been recognized, and it is therefore proposed that the rectified current is limited, namely through a lower rectified current limit. The rectified current, and thereby the generator current or stator current that is developed, can, as a result of the lower rectified current limit, not fall as far as would otherwise result from the change to the real power fed in. The generator thus generates more power, and thus more energy, than is fed into the electrical supply grid as a result of the reduction in the real power fed in. The energy in the direct voltage intermediate circuit rises, and with it the intermediate circuit voltage, until this has reached the trigger voltage. The proposed rectified current limit thus leads to this increase in the intermediate circuit voltage, and thus to triggering the chopper circuit. This leads to an interaction between the active rectifier and the chopper circuit. This interaction is of such a nature that the active rectifier prevents too great a change in the generator torque, while the chopper circuit diverts the excess energy that arises as a result.

According to one form of embodiment, it is proposed that the chopper circuit has a chopper droop function that specifies a relationship between a voltage value of the intermediate circuit voltage that exceeds the trigger voltage and a power to be diverted from the direct voltage intermediate circuit, referred to here as the chopper power. The chopper droop function can in particular represent this relationship as a linear relationship. Thus the more strongly the trigger voltage is exceeded by the intermediate circuit voltage, the more power is diverted through the chopper circuit.

Through this it can be achieved that the intermediate circuit voltage can exceed the trigger voltage, and can still continue to rise. The distance by which the intermediate circuit voltage then lies above the trigger voltage makes it possible to deduce how much power the chopper circuit is diverting at that moment. Depending on the intermediate circuit voltage, and depending in particular on the voltage value by which the intermediate circuit voltage exceeds the trigger voltage, the grid-side inverter can, for example, then control the real power fed in, or adjust the amplitude, phase angle and frequency of the output voltage in such a way that the real power is appropriately adjusted.

It may, for example, be considered that an abrupt increase in the grid voltage or an abrupt change in the phase angle of the grid leads to an abrupt reduction in the real power fed in, which in turn can have led to a downward limitation of the rectified current, with the result that the intermediate circuit voltage rises and the chopper circuit triggers. If the grid voltage now suddenly jumps back, this would lead to an abrupt increase in the real power fed in. This can also lead to stress on the generator if this sudden increase in the power has a corresponding effect on the generator, i.e., on its torque. In this case, this power increase of the real power fed in could be limited. If, however, it is possible to recognize that the chopper circuit is diverting a high power, the limitation of the increase of the real power fed in referred to above can be unnecessary or can be smaller. At least it would be possible for the real power fed in to be increased, without further consideration, by the amount with which the chopper circuit is diverting real power from the direct voltage intermediate circuit.

When implemented this can simply mean that the grid-side inverter is able to increase the real power it is feeding in, in particular can increase it in a more abrupt manner, the higher the intermediate circuit voltage is.

According to one form of embodiment it is proposed that
  a regulation specification, in particular a regulation droop function, is provided for regulating the intermediate circuit voltage, and the regulation specification is composed of
  a rectifier regulation, in particular a rectifier droop function, and a chopper regulation, in particular a (or the) chopper droop function, wherein
  the rectifier regulation specifies a relationship between the intermediate circuit voltage and the rectified current to be set through the active rectifier in such a way that
    the rectified current to be set falls with rising intermediate circuit voltage, in particular falls linearly, until the rectified current has reached the lower current limit, and
    the rectified current to be set as the intermediate circuit voltage continues to rise is held at this lower current limit, and
  the chopper regulation specifies a relationship between the intermediate circuit voltage and a (or the) chopper power to be diverted from the intermediate circuit by the chopper circuit in such a way that
    the chopper power increases with rising intermediate circuit voltage as soon the intermediate circuit voltage exceeds a (or the) trigger voltage, wherein
  the lower current limit and/or the trigger voltage are changeable, and in particular are changed depending on a working point of the wind power installation.

The intermediate circuit regulation is thus formed of an interaction between the rectifier regulation and chopper regulation. Both the rectifier regulation and the chopper regulation can each be designed as a droop function in which the relationship between the intermediate circuit voltage and the rectified current or intermediate circuit voltage and the chopper power is represented linearly, i.e., in each case as a straight line with a predefined gradient, at least in sections.

In any event, the rectifier regulation controls the rectified current to be set depending on the intermediate circuit voltage, namely in such a way that the rectified current is smaller as the intermediate circuit voltage is greater, down to the lower current limit. The generator power is thus also controlled, and thereby also the generator torque. The generator torque can be limited by the lower current limit, or too great a drop in the generator torque can be limited. Instead of controlling the rectified current, the rectifier regulation can alternatively control the generator power directly, and accordingly specify a lower power limit. This has the same effect.

If the intermediate circuit voltage now continues to rise, the rectified current, or the generator power, is no longer reduced, and counteracting of the further rise in the intermediate circuit voltage is thereby not continued. The chopper regulation can now take over, and can divert power from the intermediate circuit as chopper power, in order in that way to counteract a further rise in the intermediate circuit voltage. Since the chopper power is diverted power, it, i.e., its magnitude, rises as the intermediate circuit voltage rises further, to the extent that the intermediate circuit voltage exceeds the trigger voltage. If the intermediate circuit voltage lies below the trigger voltage, the chopper circuit remains inactive.

Since, however, it is not the torque of the generator that should be limited absolutely, but only a change that is too fast and too great, it is proposed that the lower current limit, and the trigger voltage, are made changeable, in particular are made dynamically changeable.

As far as possible this should depend on a working point of the wind power installation, in particular on the rectified current. In this way, the lower current limit can be made to follow the rectified current, in such a way, however, that changes in the rectified current remain possible, but within limits. Not only is the behavior of the rectifier regulation appropriately adjusted here, but also the chopper regulation.

It is now recognized that the rectifier regulation and the chopper regulation can be advantageously matched to one another if the trigger voltage is set depending on the lower current limit, in particular if it tracks it, so to speak. It has been recognized here that while the generator power, and thereby the generator torque, can be dynamically limited above the lower current limit, the chopper regulation, adjusted for that, can however effectively be adjusted to that by a change to the trigger voltage.

It is in particular proposed that
the lower current limit and the trigger voltage are changed depending on one another, in particular in such a way that
the trigger voltage is set depending on the lower current limit, and is also changed when there are changes to the lower current limit, and/or
the trigger voltage is set to an intermediate circuit reference value that the intermediate circuit voltage reaches when the rectified current has fallen to the current limit, and/or the trigger voltage is set depending on the intermediate circuit reference value, in particular to a value that differs by less than 5% from the intermediate circuit reference value.

Due to the current limit, in particular when there is a linear relationship in the rectifier regulation, an associated intermediate circuit voltage results which is referred to here as the intermediate circuit reference value. The trigger voltage can be set to this. In this way it is achieved that the regulation of the intermediate circuit voltage transfers from the rectifier regulation to the chopper regulation when the intermediate circuit voltage exceeds the intermediate circuit reference value. The trigger voltage is placed for this purpose at the intermediate circuit reference value, but can however differ from it slightly, quantified here with 5%. It is particularly provided that it lies at up to 5% above the intermediate circuit reference value.

It is proposed according to one form of embodiment that the lower current limit of the active rectifier is embodied as a dynamic function depending on the rectified current at that moment. The lower current limit is thus not a fixed value, but depends on the rectified current at that moment, i.e., on the value of the rectified current at that moment. It is in particular recognized here that it is not a question of an absolute limit to the rectified current, but that an excessively sharp change should be avoided.

In particular, the lower current limit of the active rectifier is designed in such a way that in the stationary case it lies at an undershoot limit below the rectified current at that moment, and in the case of a fall in the rectified current it tracks the direct current less the undershoot difference with a dynamic function. In the stationary case, the lower current limit of the active rectifier thus lies beneath the rectified current at that moment. If the rectified current then suddenly changes because the grid voltage has suddenly changed, and the grid-side inverter therefore reacts by a sudden power change, the rectified current can thus also change immediately, quickly and also suddenly. The rectified current limit thus does not hinder the dynamic properties of this grid reaction.

This sudden change, which is also allowed for the rectified current and thereby the generator current or stator current that is generated, is however limited, namely in its abrupt amplitude to the undershoot difference. The rectified current can thus fall instantaneously by at most the undershoot difference.

If the rectified current falls, in particular by the undershoot difference, the lower current limit of the active rectifier adjusts itself to that, although not immediately, but in accordance with a dynamic function. It is in particular provided here that the dynamic function exhibits a low-pass behavior, in particular a PT1 behavior, i.e., a behavior in accordance with a first order delay element.

The following example is adduced for the purposes of explanation. If the power fed in falls suddenly by, for example, 50%, then the rectified current will also want to fall by 50%. If, for example, a value of 10% is set as the undershoot difference, related to a rated value of the rectified current, then the rectified current can be reduced immediately by 10%, since the lower current limit of the active rectifier here lies initially at a value of 10% below the initial value of the rectified current. The rectified current thus now lies 10% below its initial value, and wants to reduce yet further. The tracking with the dynamic function now begins. It can, for example, be assumed here that the dynamic function exhibits a PT1 behavior. This dynamic function now causes the lower current limit of the active rectifier to track the rectified current at that moment less the undershoot difference. It thus controls the lower current limit with a PT1 behavior from 10% below the initial value to 20% below the initial value.

Since the rectified current, however, still wants to fall further, it follows this lower current limit, which is tracked with the low-pass behavior. The value that is composed of the rectified current value at that moment less the undershoot difference thus also falls. Due to the PT1 behavior, the lower current limit will thus track a continuously falling value. The result of this is a constant gradient with which the lower current limit falls.

This behavior then changes when the rectified current has reached the final value assumed above of 50% below its initial value. The rectified current then no longer falls, and the lower current limit will move from this value of 50% below the initial value in accordance with a PT1 behavior to the final value of 60% below the initial value of the rectified current.

Preferably however, the lower current limit behaves differently when the rectified current rises again. The behavior can, for example, be similar, but be configured with a much smaller time constant of the PT1 behavior. When the rectified current is rising, the lower current limit ideally immediately follows the value that is composed of the rectified current at that moment less the undershoot difference. This is preferably proposed in order to stop the rectified current rising again but, due to the PT1 behavior, the lower current limit not tracking quickly enough, and the rectified current then suddenly falling again, thereby suddenly having a distance from the lower current limit that is greater than the undershoot difference. For that reason this dynamic should not be applied when the rectified current rises, but either a significantly faster dynamic behavior, or even none at all, but an immediate tracking of this rectified current at that moment value less the undershoot difference.

According to one form of embodiment, it is proposed that the inverter, i.e., the grid-side inverter, has an upper inverter current limit so that in the event of a voltage drop of the grid voltage, a rise of the infeed current for the protection of the generator has an upward limit. The infeed current can, in principle, be composed of a real and a reactive component; here, however, only the real component is relevant, and to that extent the infeed current can also be understood as the real current fed in, or that the rise in the infeed current only relates to the real component. In other words it is proposed that the rise of the real current fed in, or the rise in the real component of the infeed current, has an upward limit.

It is particularly recognized here that in the event of a voltage drop of the grid voltage, a limitation of the mechanical stress in the wind power installation, i.e., in particular a limitation to the generator torque, can be achieved through a limitation on the infeed current. Here again, an increase in the infeed current is in principle allowed, which may be abrupt, but only up to a predetermined value.

Preferably, this upper inverter current limit is set and modified depending on an operating point of the wind power installation, depending in particular on an operating point of the inverter and/or depending on an operating point of the intermediate circuit voltage. It is in particular proposed that the inverter current limitation is set and modified depending on the infeed current. A dynamic change again comes into consideration here, and it is recognized that an abrupt increase in particular is to be limited. A further increase can be permitted in this way, provided it does not occur with too great a step or with a gradient that is too steep.

In addition or as an alternative, the intermediate circuit voltage can also be taken into consideration. If it is high, a higher inverter current limitation can be chosen, and a more marked change in the infeed current, and thereby the real power fed in, can then thus be permitted. As already explained above, it is namely possible to take into consideration here the fact that at a high intermediate circuit voltage, an increase in the power feed initially only leads to a reduction in the power diverted through the chopper circuit until it is eliminated. This does not lead to a torque stress, and therefore does not need to be limited. The upper inverter current limit can thus take this into consideration, and can be positioned correspondingly higher.

Preferably it is proposed that the upper inverter current limit is configured as a dynamic function depending on the infeed current at that moment. It is thus not fixed, but is adapted to the infeed current at that moment.

The inverter current limit is in particular configured such that in the stationary case it is located an overshoot distance above the infeed current at that moment. In any event this means that an increase in the infeed current, and thereby an increase in the real power fed in, is immediately possible, but only up to this value of the overshoot difference.

In the event of a rise in the infeed current, the inverter current limitation tracks the infeed current plus the overshoot difference with a dynamic function. Here again, as in the lower current limitation of the active rectifier, a dynamic function is proposed having a low-pass behavior, in particular a PT1 behavior. The explanation described in this connection regarding the lower current limit of the active rectifier applies in principle to a rise in the infeed current. Here again it is correspondingly proposed that in the event that the infeed current falls, it is not tracked by the same PT1 behavior, but either tracked with a fast dynamic, or tracked immediately without a dynamic behavior.

The overshoot difference preferably depends on the intermediate circuit voltage. In particular it can be composed additively of a value that depends on the intermediate circuit voltage and a further value, for example one that can have a fixed definition. In particular it is proposed that the overshoot difference depends on an overshoot value by which the intermediate circuit voltage exceeds the trigger voltage. The trigger voltage is thus that voltage at which the chopper circuit responds and diverts power. The higher the intermediate circuit voltage is located above this trigger voltage, the greater can the overshoot difference be chosen.

The overshoot difference preferably is composed additively of a first and a second partial value. The first partial value depends on the inverter and/or can be predefined, while the second partial value depends on the intermediate circuit voltage. Preferably, the second partial value is proportional to an overshoot value by which the intermediate circuit voltage exceeds the trigger voltage.

It is proposed according to one form of embodiment, that an increase in the real power fed in is limited to a value in the range from 5% to 20% above the real power fed in in relation to the real power fed in or in relation to a rated power of the wind power installation. At the same time it is proposed that a reduction of the real power fed in of up to a value of −100% in relation to the real power fed in or in relation to the rated power of the wind power installation is permitted. The real power can thus be increased by 5 to 20%, or can be reduced to the extent that the wind power installation draws real power from the electrical supply grid, namely to the value to which it had fed or even to the value that corresponds to its rated power.

It is recognized here in particular that a voltage-impressing feed is also possible without a large energy store, i.e., without a battery station, if appropriate limits are set. It is recognized in this case that an increase in real power is only possible to a limited extent, whereas, however a reduction of the real power fed is possible to a large extent, even without this large energy store. This reduction can even go so far that real power with a magnitude of the rated power of the wind power installation is withdrawn from the electrical supply grid. Mechanical overload to the wind power installation is avoided here through the measures described.

A wind power installation is also provided. This wind power installation is designed as was explained above in connection with the explanations of the feed method. The wind power installation here comprises an installation controller that is prepared for controlling the feed appropriately.

The installation controller can comprise for this purpose a corresponding process computer that in particular can control the grid-side inverter, the chopper circuit and/or the active rectifier.

It is in particular proposed that the wind power installation is configured, in particular that its installation controller is configured, to carry out a method according to one of the forms of embodiment described above.

BRIEF DESCRIPTION OF THE SEVERAL VIEWS OF THE DRAWINGS

The invention is explained in more detail below on the basis of forms of embodiment and with reference to the accompanying figures.

DETAILED DESCRIPTION

Figure 1:
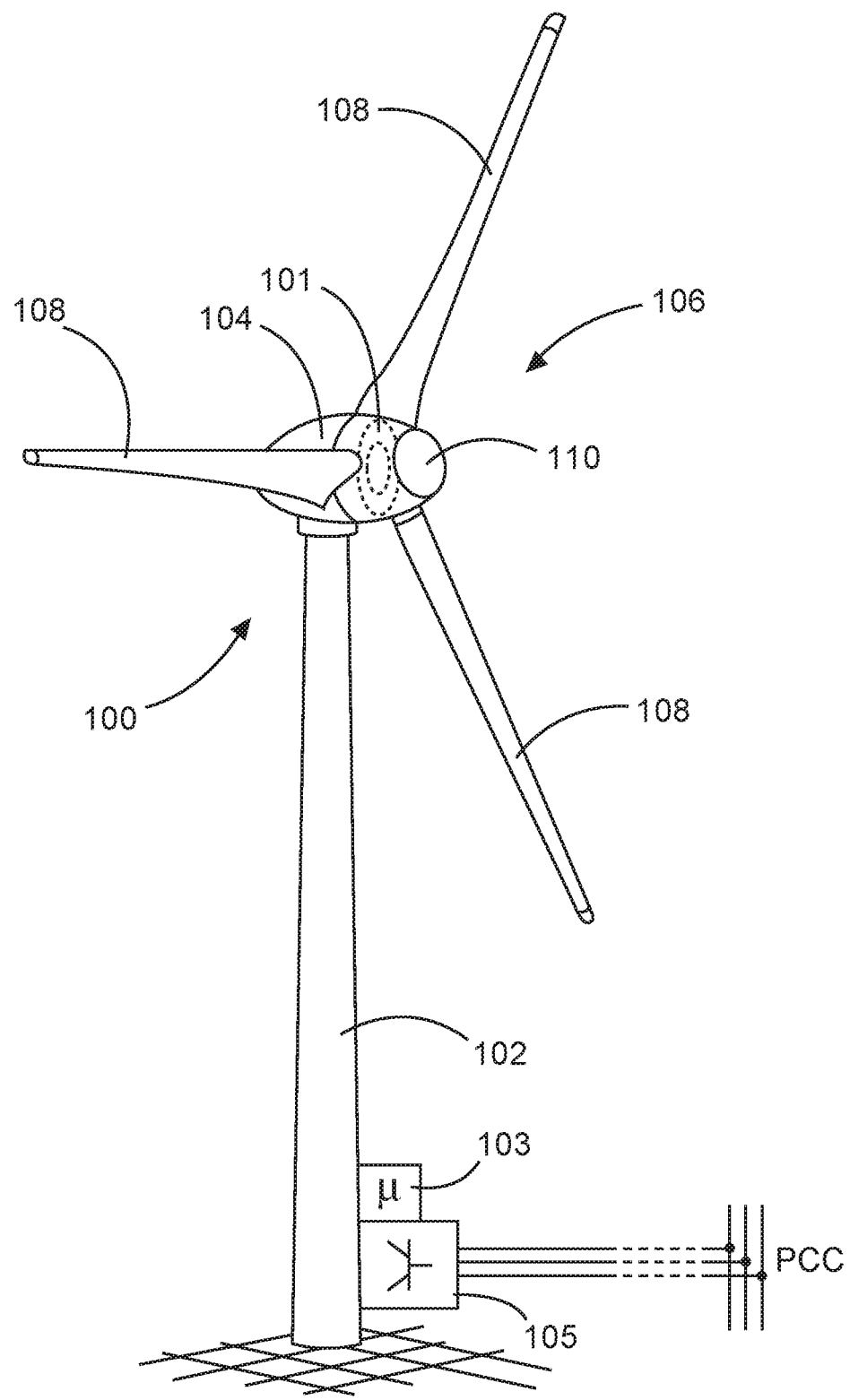
FIG. 1 shows a perspective view of a wind power installation.

FIG. 1 shows a wind power installation 100 with a tower 102 and a nacelle 104. A rotor 106 with three rotor blades 108 and a spinner 110 is arranged at the nacelle 104. The rotor 106 when operating is set into rotary movement by the wind, thereby driving a generator in the nacelle 104.

The wind power installation 100 here comprises an electric generator 101 that is suggested in the nacelle 104. Electrical power can be generated by means of the generator 101. A feed unit 105 is provided for feeding electrical power, and can in particular be designed as an inverter. With this, a three-phase infeed current and/or a three-phase infeed voltage can be generated according to amplitude, frequency and phase for feeding to a grid connection point PCC. This can be done directly, or together with further wind power installations in a wind farm. An installation controller 103 is provided for controlling the wind power installation 100 as well as the feed unit 105. The installation controller 103 can also receive specified values from outside, in particular from a central farm computer.

Figure 2:
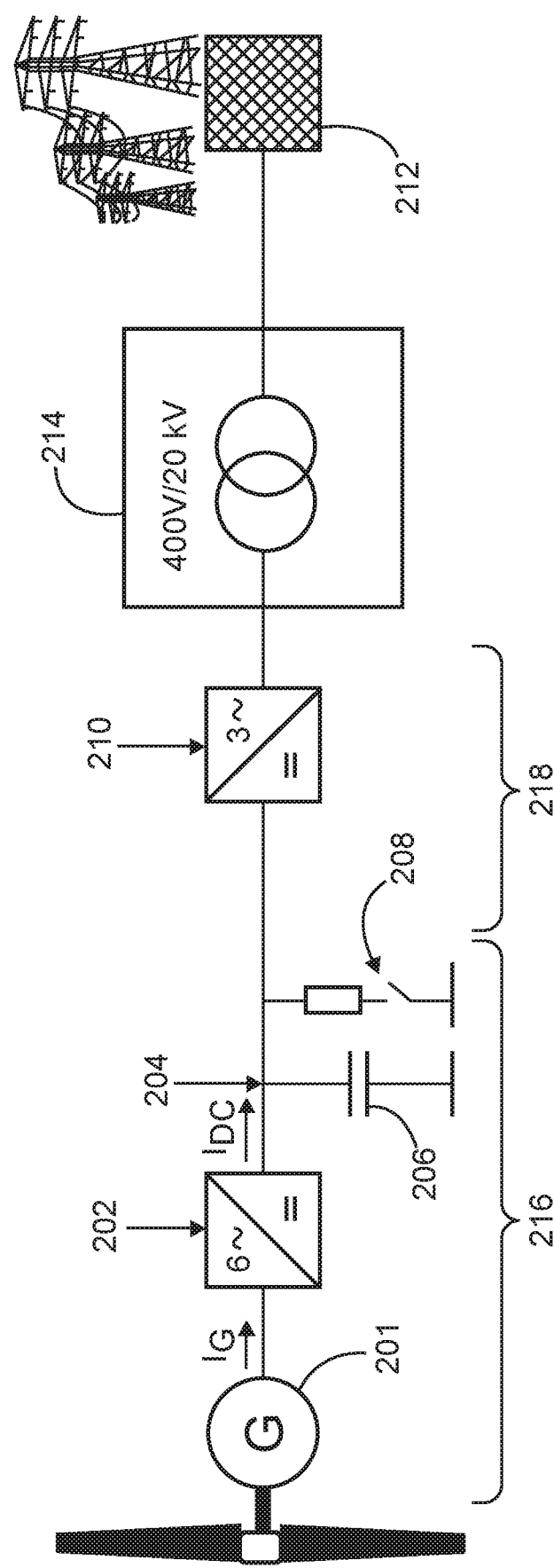
FIG. 2 shows schematically an electrical power path of a wind power installation from the generator through to the electrical supply grid.

FIG. 2 shows the power path of the electrical power. It starts at the generator 201, which can be designed as a synchronous generator, and which, as the generator current $I_G$, generates an alternating electric current, in particular a stator current. The generator current $I_G$ is rectified by the active rectifier 202, and passed as rectified current $I_{DC}$ to a direct voltage intermediate circuit 204. The generator current $I_G$, in particular the stator current, is thereby also controlled. A generator current $I_G$ can also be controlled thereby, which puts power into the generator when electrical power is drawn from the electrical supply grid.

The direct voltage intermediate circuit 204 comprises an intermediate circuit capacitor 206 that can also be referred to as a smoothing capacitor. A chopper circuit 208, which can divert electrical power and thereby electrical energy out of the direct voltage intermediate circuit, is also connected to the direct voltage intermediate circuit 204.

An infeed current is generated as alternating current from the direct voltage intermediate circuit 204 with a grid-side inverter 210, in order thereby to feed electrical power, namely real power, into the electrical supply grid 212. A transformer 214 is also arranged between the inverter 210 and the electrical supply grid 212.

The wind power installation, and in particular the grid-side inverter 210, here operate in a voltage-impressing, in particular grid-forming, manner.

The rectifier 202 together with the chopper circuit 208 here performs regulation of the direct voltage intermediate circuit, i.e., of the intermediate circuit voltage. This regulation can be referred to as intermediate circuit regulation 216. The rectifier 202 performs regulation of the intermediate circuit voltage that includes a lower current limit for the rectified current. If the lower current limit is reached, the intermediate circuit voltage can no longer be maintained by the rectifier 202, and the chopper circuit 208 can then take over the regulation of the intermediate circuit voltage. For that reason, the rectifier 202 and the chopper circuit 208 perform the regulation of the intermediate circuit voltage together. This thus distinguishes it from a variant in which the rectifier, without a lower current limit, or with a lower current limit that is very much higher, carries out the regulation of the intermediate circuit voltage alone.

A dynamic current limit 218 is, moreover, implemented in the inverter 210, which prevents excessively large jumps in the infeed current in order thereby to avoid large jumps in the torque at the generator.

Figure 3:
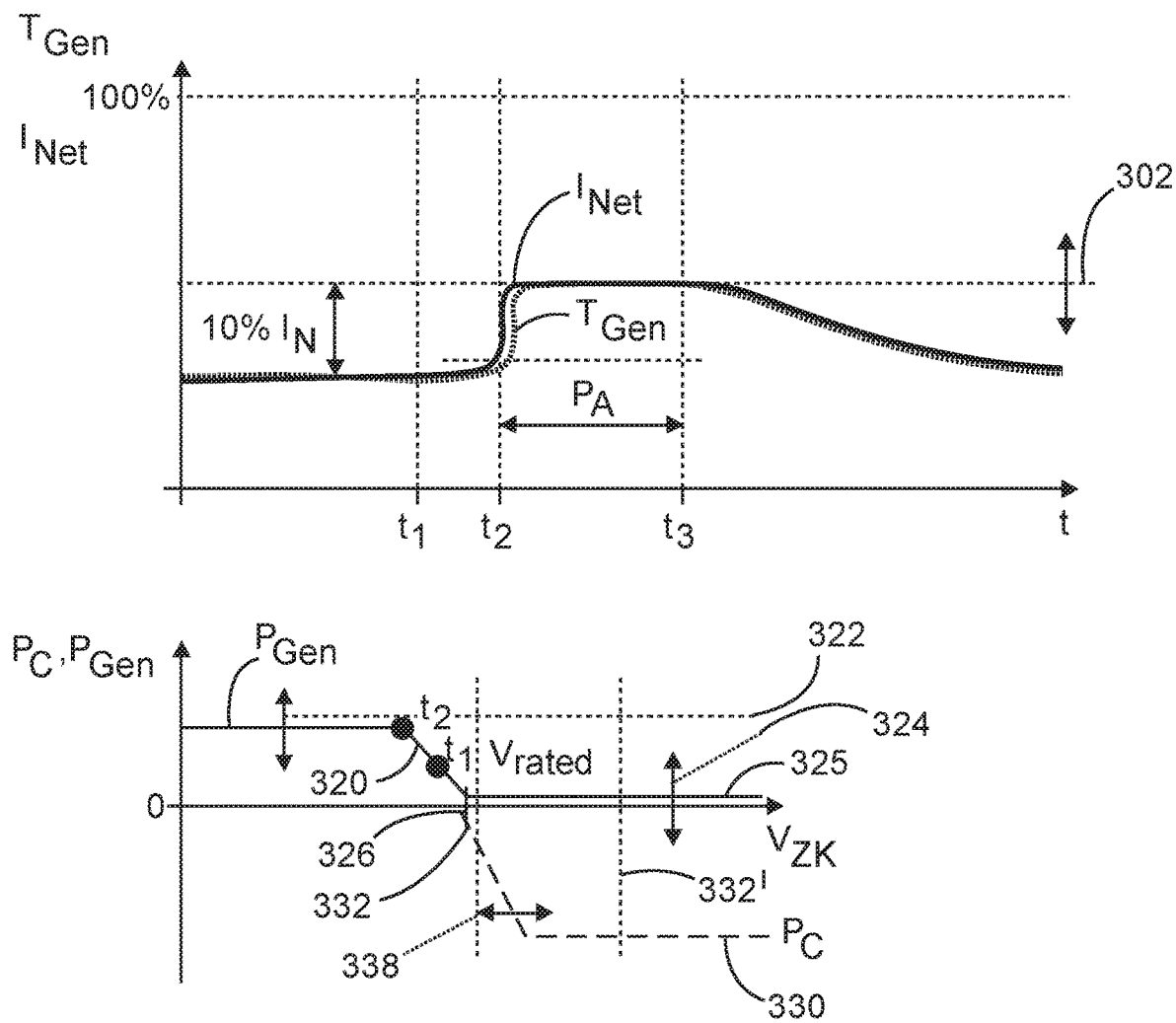
FIG. 3 shows a diagram with two partial diagrams for the explanation of the proposed method for an increase in the infeed current.

FIG. 3 shows two partial diagrams that explain at least a part of the mode of operation of the proposed method.

A curve against time of an infeed current $I_{Net}$ fed into the electrical supply grid and of an associated torque $T_{Gen}$ is shown for an exemplary situation in the upper diagram.

It is assumed in the exemplary situation that a large current pulse, above an infeed current at that moment, arises in the grid. For this purpose a lower current limit 302 is provided, which is reached by the infeed current and which can, for example, lie above the infeed current at that moment by 10% of the rated current IN. In this example, the maximum current, power and torque pulse in the positive direction is thus 10%. A torque pulse corresponding to the limit minus the current at that moment is thus permitted by the dynamic current limit. This current limit 302 is thus movable, as is suggested by the double arrow. The impulse begins at time point $t_2$, and ends at time point $t_3$; and between them, the result is an adjustment power $P_A$ that acts for the intermediate period of time, as suggested by a double arrow, even though its height is limited. It can thus be regulated without, however, overloading the wind power installation.

The limitation can also be done using a droop function of the intermediate circuit regulation. The grid-side voltage-impressing inverter would then limit the infeed current as the intermediate circuit voltage collapses. It would then recognize its current limitation by way of the intermediate circuit voltage.

Following the jump in the torque, the limits are brought toward the working point at that moment following a PT1 characteristic. The delay characteristic results from the permitted mechanical loading.

The lower partial diagram of FIG. 3 shows how a realization of the method can be carried out by means of appropriately set droop functions. Droop functions specify a relationship, in particular a linear relationship, between an input magnitude and an output magnitude. A rectifier droop function 320 has been taken as a basis here, giving a relationship between the intermediate circuit voltage $V_{ZK}$ and the generator power $P_{Gen}$. It is illustrated as solid lines.

For the sake of simplicity, the rectifier droop function here is then shown at a level somewhat above the coordinate axis which marks a normal or mean value. At low intermediate circuit voltages, the generator power $P_{Gen}$ accordingly increased in accordance with the rectifier droop function 320, up to a maximum value.

In the example shown, there is still no current pulse or current jump at time point $t_1$. The time points from the upper partial diagram are drawn, for better orientation, in the lower partial diagram as working points of the direct voltage regulation. At time point $t_1$, i.e., during normal operation, the corresponding working point is located at an edge of the droop function of the rectifier, i.e., of the rectifier droop function 320. The rectifier thus performs a regulation of the intermediate circuit voltage.

The current pulse occurs at time point $t_2$; this can be triggered by a phase jump in the grid voltage, as a result of which the intermediate circuit voltage falls, which changes the working point. The generator power $P_{Gen}$ consequently rises up to a maximum value in accordance with the rectifier droop function 320. This is adjusted to the current limit of the grid-side inverter.

The chopper droop function 330, which is also drawn and illustrated as dashed lines, is not used in this example, since the intermediate circuit voltage falls below its rated value, and the chopper circuit is thus not triggered. The rectifier droop function 320, as well as the chopper droop function 330, are dynamically changeable, and are here representative of a rectifier regulation or a chopper regulation. It is particularly proposed for the rectifier characteristic 320 that its end values can be changed for this purpose. This is suggested by the first and second double change arrows 322 and 324.

The lower end value of the rectifier characteristic 320 here forms a lower power limit 325 which can be realized by a lower current limit, or vice versa. This lower power limit 325 is dynamically changeable, as is suggested by the double change arrow 324. The edge of the rectifier characteristic 320 reaches as far as the intermediate circuit reference value 326 of the intermediate circuit voltage $V_{ZK}$. The intermediate circuit reference value 326 also changes, depending on what type of power limit 325 has been set. The chopper characteristic 330 can be correspondingly adjusted, in that the trigger voltage 332 is placed at the intermediate circuit reference value 326. This can be recognized in FIG. 3 in that the chopper droop function 330 reaches the abscissa, i.e., the zero line at the intermediate circuit reference value 326.

A fixed trigger voltage 332' can alternatively be provided, located at a fixed value above the intermediate circuit reference value 326, and also above a rated voltage of the intermediate circuit voltage $V_{ZK}$.

Figure 4:
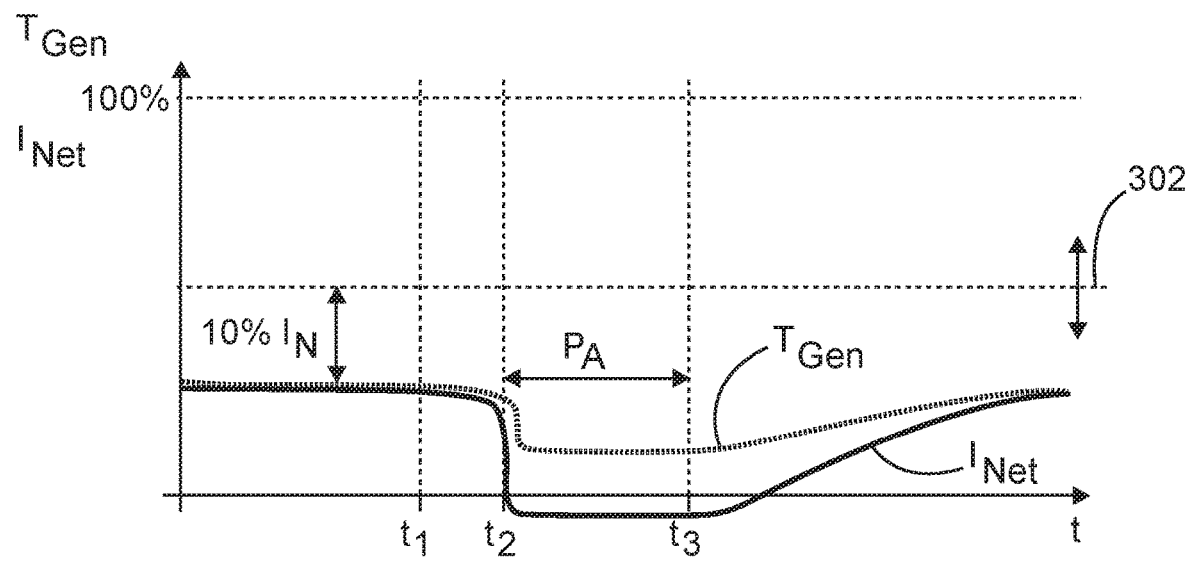
FIG. 4 shows a diagram with two partial diagrams for the explanation of the proposed method for a reduction in the infeed current.
Figure 4:
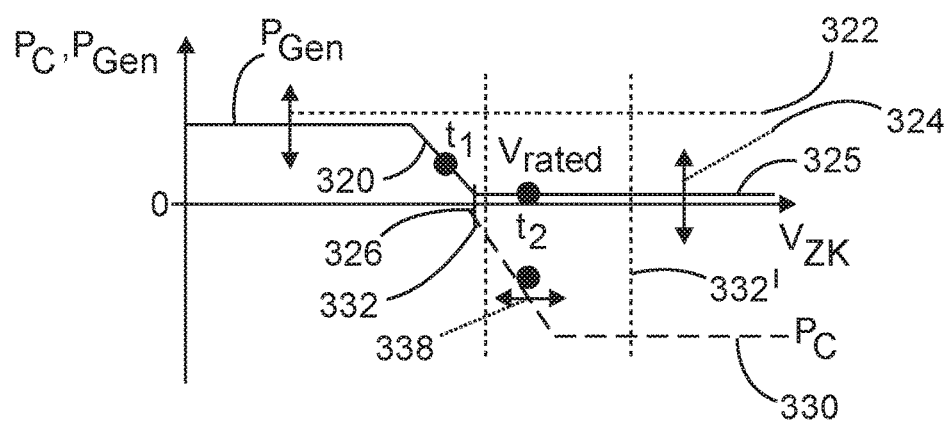

The explanations of the lower diagram are identical to those for FIG. 4, except for the explanations of the operating points. The chopper droop function 330, which was explained above in relation to FIG. 3, does not have any effect on the operating situation of FIG. 3. An operating situation is therefore shown below in connection with FIG. 4, in which the chopper droop function 330 does have its effect, in particular in cooperation with the rectifier droop function 320.

FIG. 4 thus shows an operating situation in which the fed power, i.e., the real power, falls suddenly. This is referred to here as a negative load jump. Normal operation is still present at time t1 and thus, as in FIG. 3, the time point t1 is shown at an edge of the rectifier droop function 320, which is represented here by three solid lines. The rectifier droop function 320, as well as the chopper droop function 330, are here identical to FIG. 3, since the present FIG. 4 only shows a changed operating situation, but not a changed control.

The sudden collapse in the fed power, and thereby of the infeed current $I_{Net}$, i.e., the negative load jump, occurs at time $t_2$. The intermediate circuit voltage $V_{ZK}$ rises as a result. The working point consequently changes along the rectifier droop function 320. The rectifier droop function 320 however falls with rising intermediate circuit voltage only as far as the power limit 325, in order thus to reach a limit value for the associated generator power. Here again, the power limit 325 is shown above the coordinate axis that identifies the power value of zero.

The rectifier thus only steers the rectified current, and thereby finally the generator power, after the fall in the intermediate circuit voltage to the point at which the right-hand horizontal branch of the rectifier droop function is reached, i.e., until the power limit 325 is reached. The generator torque does therefore fall somewhat, but not completely.

The working point, or a working point, does however lie on the chopper droop function 330, and falls further with it as the intermediate circuit voltage increases. The trigger voltage 332 is placed here at the intermediate circuit reference value 326.

The chopper circuit accordingly draws power out of the intermediate circuit. As a result of this, the generator torque could be limited, but a further fall in the power fed does not have to be restricted. This is clarified by the illustration of the infeed current $I_{Net}$. The generator torque $T_{Gen}$ and the infeed current $I_{Net}$ are each shown normalized with respect to their rated value in the upper partial diagram, so that without the limitation of the torque described they would have to lie approximately on top of one another.

In the event of negative load jumps, the torque pulse is thus limited through the dynamic limits in the droop function of the intermediate circuit regulation.

The chopper droop function 330 can also be shifted dynamically, in order to take over the further power. It is particularly proposed that for this purpose the trigger voltage 332 is made to track the intermediate circuit reference value 326, whereby a change in the power limit 325 is tracked, i.e., a change in the lower current limit. The chopper droop function 330 is of course correspondingly adjusted, in that its edges are shifted, as is suggested by the double arrow 338. A shift in the lower power limit according to the change arrow 324 thus leads to a change in the chopper droop function according to the double arrow 338.

In the FIG. 4, as corrected the beginning of the chopper droop function 330, which can also be referred to as the characteristic chopper curve, thus of course only starts at the zero point which is located on the abscissa of the intermediate circuit voltage. Two possibilities are proposed for the placement of the characteristic chopper curve. Either the characteristic chopper curve is to the right of the entire droop function of the intermediate circuit regulation, i.e., according to FIGS. 3 and 4, to the right of the edge of the rectifier droop function 320, i.e., to the right of the intermediate circuit reference value 326. If the rectified current is limited, i.e., if the generator power is limited, the intermediate circuit voltage must first achieve a certain level before the chopper circuit becomes active. This is drawn with the alternative trigger voltage 332' as an alternative possibility.

The second possibility is a shift to the left. The beginning is then the intermediate circuit voltage at which the limitation of the current starts, i.e., at the intermediate circuit reference value 326, which is drawn in FIGS. 3 and 4 as the main variant. Together with the dynamic limit of the power limit 325, a continuous regulation thus results.

The maximum current, power and torque pulse for the generator in the negative direction is 10%. The infeed current can, however, drop much more quickly yet without risking an overload of the generator.

The chopper circuit, which can be identified simply as the chopper, takes up the additional power (approximately 15% in this case). Two working points form at $t_2$.

Following the jump in the torque, the limits are brought to approach the working point at that moment following a PT1 characteristic. The delay characteristic results from the permitted mechanical loading. The rectifier furthermore takes over the power, with a delay, that is converted in the chopper.

Thus with the proposed method, the following situation is avoided or improved:

Without the proposed limits, a grid-side current pulse that can arise in the presence of the voltage change from a voltage-impressing feed, flows almost unhindered into the generator torque. The generator torque can thus rise equally sharply. A chopper circuit would, however, not become active even in the case of negative power gradients, since the change in the voltage of the intermediate circuit voltage resulting from the negative power gradients would be compensated for by the active rectifier.

The chopper circuit only takes over when the generator-side rectifier reaches its current limit. The current, power and torque jumps would thus not be limited, and jumps of this sort can reach up to 100% of the rated value.

A solution is thus created that enables a provision of grid-forming properties with a wind power installation, without (or without large) over-dimensioning of the mechanical system, and without the integration of an electrical store going beyond a usual intermediate circuit capacitor.

It is considered that the mechanical system of a wind power installation, which can also be labelled WEA, can sustain torque jumps of, for example, a maximum of 10%. Grid-forming properties at the installation terminals however require intermediate circuit regulation on the generator side, which can lead to high transients in the torque. It acts like a direct coupling of the generator to the grid.

The idea is to limit load pulses through impressing a voltage in a positive and a negative direction. In the positive direction, i.e., when the real infeed power or the associated real power $I_{ist}$ of the infeed current $I_{Net}$ is increased, this can in particular result from a limitation of the output current to, for example, $I_{ist}+10\%$ $I_N$. Alternatively or in addition, the limit in the droop function of the intermediate circuit regulation can be adjusted dynamically.

In the negative direction, i.e., when the fed power or the associated real power $I_{Net}$ or $I_{ist}$ is reduced, the limitation preferably takes place through a dynamic adjustment of a chopper droop function and a limitation of the droop function of the intermediate circuit regulation of the generator-side converter, which can also be referred to as generator-side inverter or active rectifier.

The tracking after a load pulse takes place by means of a time delay, for example in accordance with a PT1 behavior.

In the case of an increase of the fed power, a current limitation can take place directly at the grid-side, voltage-impressing inverter, or a sharply collapsing intermediate circuit voltage is reacted to with a current limitation. Such a collapsing intermediate circuit voltage can result if the active rectifier, i.e., the generator-side rectifier, limits the torque jump.

Classically, a wind power installation is constructed such that the generator is decoupled from the grid. Regulation of the intermediate circuit voltage takes place through the grid-side inverter.

A wind power installation with a grid-forming converter or inverter can be constructed such that the generator is decoupled from the grid in that an intermediate circuit regulation, i.e., a regulation of the intermediate circuit voltage, takes place by means of a battery store with a direct current chopper. The battery store is coupled for this purpose via the chopper, which can thus also be referred to as the storage-side DC/DC chopper. The battery store can perform the regulation of the intermediate circuit voltage.

To avoid this complexity with the battery store, a wind power installation with a grid-forming converter or grid-forming inverter is proposed, in which the generator is fundamentally coupled to the grid, i.e., to the electrical supply grid, namely through an intermediate circuit regulation through a generator-side inverter that can also be referred to as the generator-side rectifier or the active rectifier.

It is now proposed that the generator is decoupled from the grid for the wind power installation with grid-forming converter or inverter. An intermediate circuit regulation by a chopper circuit, which can also synonymously be referred to simply as the chopper, with generator-side active rectifier is proposed for this purpose. A torque regulation is here realized through a dynamic, grid-side current limit.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for feeding electrical power into an electrical supply grid having a grid voltage by a wind power installation, comprising:

generating, by a generator, a generator current;

rectifying, by an active rectifier coupled to the generator, the generator current into a rectified current;

receiving, by a direct voltage intermediate circuit coupled to the active rectifier and having an intermediate circuit voltage, the rectified current;

diverting, by a chopper circuit coupled to the direct voltage intermediate circuit, excess energy out of the direct voltage intermediate circuit;

generating, by an inverter coupled to the direct voltage intermediate circuit, an infeed current; and feeding the infeed current into the electrical supply grid in a voltage-impressing manner, wherein the inverter is configured to adjust the infeed current to counteract a deviation of the grid voltage from a voltage setpoint value, wherein:

the active rectifier has a lower current limit operative to, in response to a change in an amplitude or phase of the grid voltage, limit a drop in the rectified current to protect the generator, the lower current limit is set and changed based on an operating point of the wind power installation, and the chopper circuit is controlled to divert the excess energy arising in the direct voltage intermediate circuit or a portion of the excess energy arising in the direct voltage intermediate circuit in response to current limiting of the active rectifier.

2. The method as claimed in claim 1, wherein the operating point of the wind power installation is an operating point of the active rectifier.

3. The method as claimed in claim 1, wherein:
the chopper circuit is configured to divert the excess energy from the direct voltage intermediate circuit in response to the intermediate circuit voltage reaching a threshold voltage,
the active rectifier is controlled by the rectified current and the active rectifier regulates the intermediate circuit voltage, and
in response to the rectified current reaching the lower current limit, the rectified current is limited, the intermediate circuit voltage rises and reaches the threshold voltage, and the chopper circuit responds and diverts the excess energy away from the direct voltage intermediate circuit.

4. The method as claimed in claim 3, wherein the active rectifier regulates the intermediate circuit voltage to a voltage value or a range of voltage values below the threshold voltage based on a rectifier droop function.

5. The method as claimed in claim 1, wherein the chopper circuit diverts the excess energy based on a chopper droop function that specifies a relationship between a chopper power to be diverted from the direct voltage intermediate circuit and a difference between the intermediate circuit voltage and a threshold voltage.

6. The method as claimed in claim 5, wherein the chopper droop function specifies a linear relationship.

7. The method as claimed in claim 1, wherein:
using a regulation specification to regulate the intermediate circuit voltage, wherein the regulation specification includes a rectifier regulation and a chopper regulation, wherein:
the rectifier regulation specifies a relationship between the intermediate circuit voltage and the rectified current, wherein the rectified current is set by the active rectifier such that:
the rectified current falls with a rising intermediate circuit voltage until the rectified current reaches the lower current limit, and
the rectified current is held at the lower current limit as the intermediate circuit voltage continues to rise, and
the chopper regulation specifies a relationship between the intermediate circuit voltage and chopper power to be diverted from the direct voltage intermediate circuit by the chopper circuit such that:
in response to the intermediate circuit voltage exceeding a threshold voltage, the chopper power increases with the rising intermediate circuit voltage, wherein the lower current limit is changed depending on the threshold voltage or the threshold voltage is changed depending on the lower current limit.

8. The method as claimed in claim 7, wherein the regulation specification is a regulation droop function, the rectifier regulation is a rectifier droop function and the chopper regulation is a chopper droop function.

9. The method as claimed in claim 7, wherein the rectified current falls linearly with the rising intermediate circuit voltage.

10. The method as claimed in claim 7, wherein the threshold voltage is changeable based on the operating point of the wind power installation, and wherein:
the threshold voltage is set depending on the lower current limit and is changed in response to a change in the lower current limit,
the threshold voltage is set to an intermediate circuit reference value that the intermediate circuit voltage reaches when the rectified current has fallen to the lower current limit, or
the threshold voltage is set depending on the intermediate circuit reference value and to a value that differs from the intermediate circuit reference value by less than 5%.

11. The method as claimed in claim 1, wherein:
the lower current limit of the active rectifier is a dynamic function that depends on an instantaneous rectified current.

12. The method as claimed in claim 11, wherein:
in a stationary case, the lower current limit is less than the rectified current by an undershoot difference, and
in an event of a fall in the rectified current, the lower current limit tracks, using the dynamic function, the rectified current less the undershoot difference, wherein the dynamic function has a low-pass behavior.

13. The method as claimed in claim 1, wherein:
the inverter has an upper inverter current limit, and
in response to a voltage drop in the grid voltage, the upper inverter current limit is operative to place an upper limit on a rise of the infeed current to protect the generator.

14. The method as claimed in claim 13, wherein the upper inverter current limit is set and changed depending on the operating point of the wind power installation.

15. The method as claimed in claim 14, wherein the operating point of the wind power installation is an operating point of the inverter or an operating point of the intermediate circuit voltage.

16. The method as claimed in claim 13, wherein:
the upper inverter current limit is a dynamic function that depends on an instantaneous infeed current,
in a stationary case, the upper inverter current limit is above the instantaneous infeed current by an overshoot difference, and
in an event of a rise in the infeed current, the upper inverter current limit tracks a sum of the instantaneous infeed current and the overshoot difference, wherein the dynamic function has a low-pass behavior.

17. The method as claimed in claim 16, wherein the overshoot difference is based on an overshoot value by which the intermediate circuit voltage exceeds a threshold voltage.

18. The method as claimed in claim 1, wherein:
an increase in a real power fed in is limited to 5% to 20% above the real power fed in or in relation to a rated power of the wind power installation, and
a reduction of the real power fed in of up to a value of −100% in relation to the real power fed in or in relation to the rated power of the wind power installation is permitted.

19. A wind power installation for feeding electrical power into an electrical supply grid having a grid voltage, the wind power installation comprising:
a generator configured to generate a generator current;
an active rectifier coupled to the generator configured to rectify the generator current into a rectified current;
a direct voltage intermediate circuit coupled to the active rectifier and having an intermediate circuit voltage for receiving the rectified current;

a chopper circuit coupled to the direct voltage intermediate circuit configured to divert excess energy out of the direct voltage intermediate circuit;

an inverter coupled to the direct voltage intermediate circuit configured to generate an infeed current for feeding into the electrical supply grid; and an installation controller configured to control the feeding of the infeed current by at least:

feeding the infeed current in a voltage-impressing manner, wherein the inverter is configured to adjust the infeed current to counteract a deviation of the grid voltage from a voltage setpoint value, wherein the active rectifier has a lower current limit operative to, in response to a change in an amplitude or phase of the grid voltage, limit a drop in the rectified current to protect the generator, wherein the lower current limit is set and changed based on an operating point of the wind power installation, and wherein the chopper circuit is controlled to divert excess energy arising in the direct voltage intermediate circuit or a portion of the excess energy arising in the direct voltage intermediate circuit in response to current limiting the active rectifier.

\* \* \* \* \*